(12) United States Patent
Kang et al.

(10) Patent No.: US 7,718,031 B2
(45) Date of Patent: May 18, 2010

(54) MASK FRAME AND METHOD OF FIXING MASK ON THE MASK FRAME

(75) Inventors: Hee-Cheol Kang, Kyunggi-do (KR); Jin-Kyoo Kim, Kyunggi-do (KR)

(73) Assignee: Samsung Mobile Display Co., Ltd., Yongin, Gyunggi-Do (KR)

( * ) Notice: Subject to any disclaimer, the term of this patent is extended or adjusted under 35 U.S.C. 154(b) by 293 days.

(21) Appl. No.: 11/325,560

(22) Filed: Jan. 5, 2006

(65) Prior Publication Data

US 2006/0148368 A1 Jul. 6, 2006

(30) Foreign Application Priority Data

Jan. 5, 2005 (KR) .................. 10-2005-0000962

(51) Int. Cl.
  *C23F 1/00* (2006.01)
  *H01L 21/306* (2006.01)
  *B29D 11/00* (2006.01)
  *H01J 9/12* (2006.01)

(52) U.S. Cl. .................. 156/345.3; 264/1.21; 445/47

(58) Field of Classification Search .............. 156/345.3; 264/1.21; 445/47
See application file for complete search history.

(56) References Cited

U.S. PATENT DOCUMENTS

| 4,372,248 | A * | 2/1983 | Martin ................. 118/720 |
| 4,511,599 | A * | 4/1985 | Rustomji ................. 427/66 |
| 5,803,391 | A * | 9/1998 | Saperstein et al. ........ 242/395 |
| 6,446,948 | B1 * | 9/2002 | Allen ..................... 269/21 |
| 2003/0197841 | A1 * | 10/2003 | Araki et al. ............... 355/50 |
| 2004/0020435 | A1 * | 2/2004 | Tsuchiya et al. ....... 118/723 VE |
| 2004/0115342 | A1 * | 6/2004 | Shigemura .............. 427/143 |
| 2004/0163592 | A1 * | 8/2004 | Abiko et al. ............. 118/715 |

FOREIGN PATENT DOCUMENTS

| JP | 2003-050468 | 2/2003 |
| JP | 2004-061577 | 2/2004 |
| JP | 2004-191661 | 7/2004 |
| JP | 2004-307976 | 11/2004 |
| KR | 10-1997-0051901 | 7/1997 |
| KR | 10-2004-0067053 | 7/2004 |
| TW | 593788 | 4/2003 |

(Continued)

OTHER PUBLICATIONS

*Office action* from the State Intellectual Property Office of P.R. China issued in Applicant's corresponding Chinese Patent Application 200510137658.8 dated Sep. 12, 2008.

(Continued)

*Primary Examiner*—Michael Cleveland
*Assistant Examiner*—Keath T Chen
(74) *Attorney, Agent, or Firm*—Robert E. Bushnell, Esq.

(57) ABSTRACT

A mask frame on which a mask, having a pattern area and a mask edge defining the pattern area, is fixed comprises: a through opening corresponding to the pattern area; and a base corresponding to the mask edge. The base is provided with discharging holes formed therein, and a vacuum pump is coupled to the discharging holes so that the mask is fixed to the mask frame without damaging the pattern formed on the pattern area of the mask.

20 Claims, 7 Drawing Sheets

FOREIGN PATENT DOCUMENTS

| TW | 545081 | 8/2003 |
|----|--------|--------|
| TW | 569645 | 1/2004 |
| TW | 589917 | 6/2004 |

OTHER PUBLICATIONS

*Preliminary examination report* from the Taiwanese Intellectual Property Office issued in Applicant's corresponding Taiwanese Patent Application 095100272 dated Dec. 29, 2007.

Request for Entry of the Accompanying Japanese Office Action.

Japanese Office action issued on Apr. 7, 2009 in Applicant's corresponding Japanese Patent Application No. 2005-337280.

Office action from Chinese Patent Office issued in Applicant's corresponding Chinese Patent Application No. 200510137658.8 dated Nov. 13, 2009, and Request for Entry of the Accompanying Office Action.

* cited by examiner

MASK FRAME AND METHOD OF FIXING MASK ON THE MASK FRAME

CLAIM OF PRIORITY

This application makes reference to, incorporates the same herein, and claims all benefits accruing under 35 U.S.C. §119 from an application earlier filed in the Korean Intellectual Property Office on 5 Jan. 2005 and there duly assigned Serial No. 10-2005-0000962.

BACKGROUND OF THE INVENTION

1. Technical Field

The present invention relates to a mask frame to which a mask used in depositing an organic material on a large-sized pattern area is fixed by welding and a method for fixing the mask on the mask frame. More particularly, the present invention relates to a mask frame capable of firmly supporting a mask which is used in depositing an organic material layer so as to fabricate a large-sized organic electroluminescent device of an organic electroluminescent display, the mask being supported without damage to a pattern before welding the mask thereon, and a method of fixing the mask on the mask frame.

2. Related Art

As a general flat panel display, an electroluminescent display is classified into an inorganic electroluminescent display and an organic electroluminescent display according to the materials used for an emission layer. The organic electroluminescent display has attracted attention because it can be driven with a low voltage, is lightweight and thin, has a wide viewing angle, and has a fast response time.

Such an organic electroluminescent display includes an organic electroluminescent device having an anode, an organic material layer and a cathode, each of which is stacked on a substrate. The organic material layer includes an organic emission layer which emits light due to exciton obtained by recombining a hole and an electron. Furthermore, to smoothly transport the hole and the electron to the emission layer and enhance emission efficiency, an electron injection layer and an electron transporting layer can be interposed between the cathode and the organic emission layer, and a hole injection layer and a hole transporting layer can be interposed between the anode and the organic emission layer.

In general, the organic electroluminescent device with this configuration can be fabricated by a physical vapor deposition method, such as vacuum deposition, ion plating, sputtering or the like, and a chemical vapor deposition method using gas reaction. Furthermore, when the organic electroluminescent device is fabricated by such methods, there is need for a mask having a predetermined pattern to stack the organic material layers in a proper place. In this regard, the mask is fixed on a mask frame in a state in which the mask is outwardly tensioned.

In addition, when the mask is fixed to the mask frame by a method, such as welding, it is necessary to employ some type of means for weighing down the tension mask during the fixation process. Such means employed during the fixation process can result in damage to the fine pattern formed on the pattern area of the mask. Thus, there is a need for a process which will not cause such damage to the mask.

SUMMARY OF THE INVENTION

Accordingly, it is an object of the present invention to provide a mask frame having a structure capable of having a mask temporarily fixed thereon without damage to a predetermined pattern located on a pattern area of the mask. The mask is fixed on the mask frame without using a weight bar before welding the mask onto the mask frame, thereby solving the problems of damage to the pattern and imposition of a worker's burden due to the weight bar. The invention also comprises a method of fixing the mask on the mask frame so as to achieve the same object.

The forgoing and/or other objects of the present invention are achieved by providing a mask frame on which a mask having a pattern area and a mask edge defining the pattern area is fixed, the mask frame comprising: a through opening corresponding to the pattern area; and a base corresponding to the mask edge. The base is formed with discharging holes through which air is discharged.

Preferably, a first surface of the base, to which the mask edge is attached by vacuum suction, is formed with grooves having a width which is larger than the discharging hole, the grooves communicating with the discharging hole.

Another object of the present invention is achieved by providing a method of fixing a mask on a mask frame, the method comprising the steps of: providing a mask frame which has a through opening having a predetermined size, a base disposed around the through opening, and a discharging hole formed on the base; seating the mask, which includes a pattern area corresponding to the through opening and an edge corresponding to the base, on the mask frame; closely attaching the mask to the mask frame by vacuum suction generated by the discharge of air through the discharging hole; and fixing the edge of the mask to the base of the mask frame by welding.

Preferably, the vacuum suction is achieved by coupling a vacuum suction means to the discharging hole. More preferably, the vacuum suction means comprises a vacuum pump.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components.

These and/or other objects and advantages of the invention will become apparent and more readily appreciated from the following description of the preferred embodiments, taken in conjunction with the accompanying drawings, of which.

DETAILED DESCRIPTION OF THE INVENTION

Exemplary embodiments of the present invention will now be described in detail with reference to the accompanying drawings. Hereinafter, the term "mask" means a steel plate formed with a pattern, and the term "mask pattern" refers to a pattern formed on a mask sheet. The following embodiments are described to enable those skilled in the art to obtain a thorough understanding of the invention. A variety of modifications can be made to the invention and it should be noted that the present invention is not limited to the embodiments disclosed herein.

Figure 1:
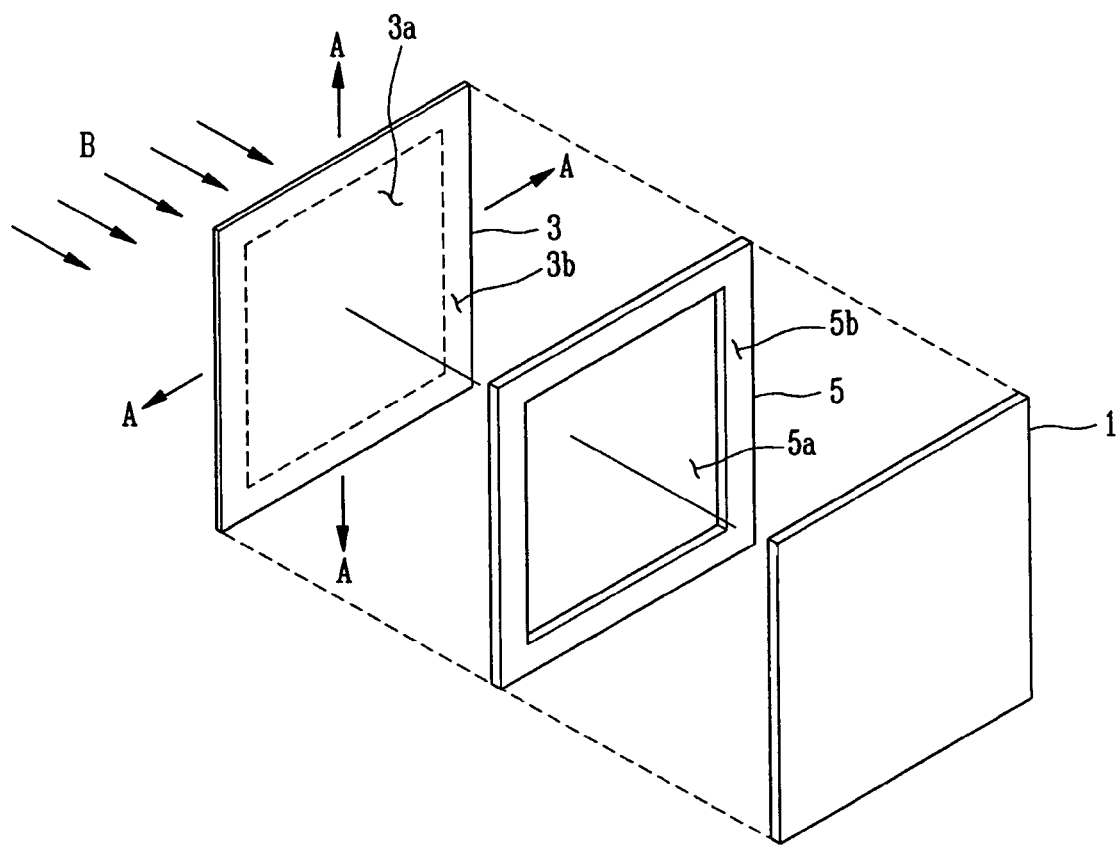
FIG. 1 is an exploded perspective view schematically illustrating a mask for fabricating an organic electroluminescent device.
Figure 2:
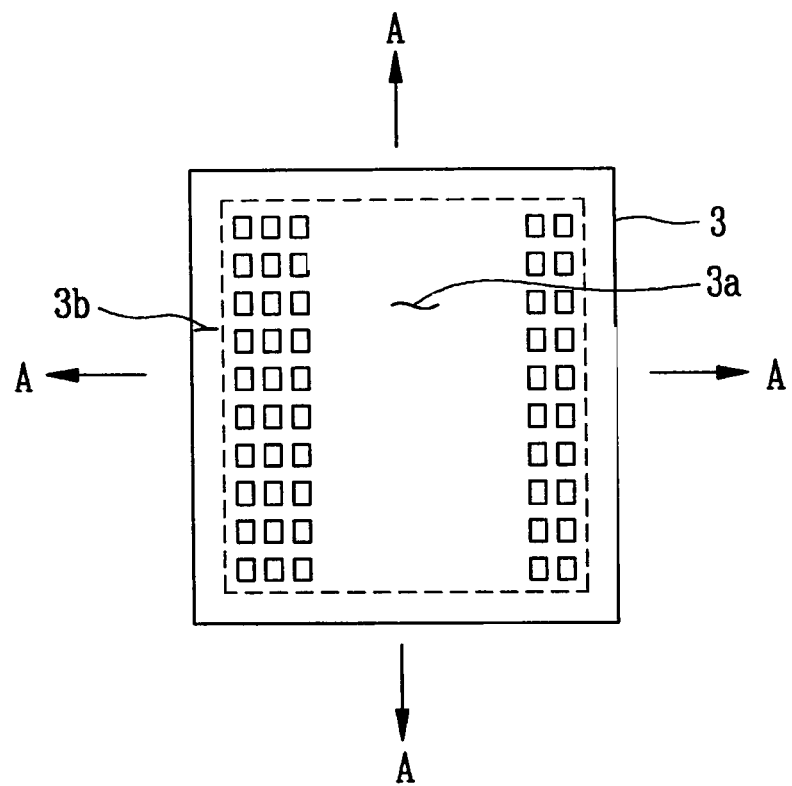
FIG. 2 is a plan view of a mask formed with a pattern.
Figure 3:
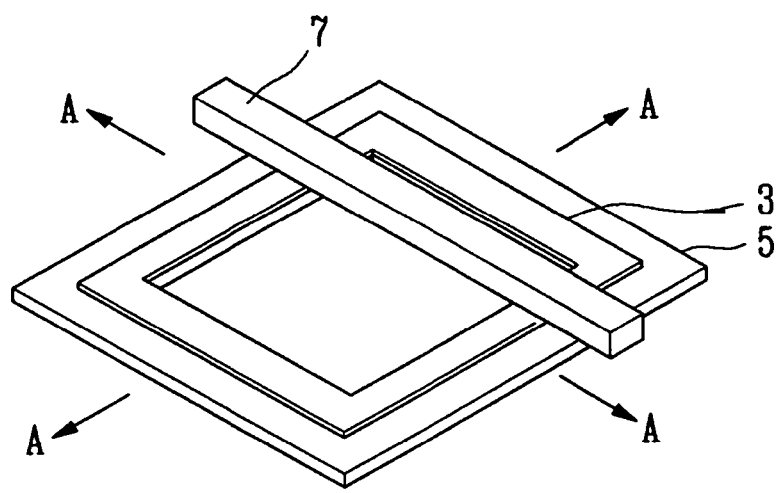
FIG. 3 is a perspective view illustrating that the mask is fixed onto a mask frame by a weight bar.
Figure 4:
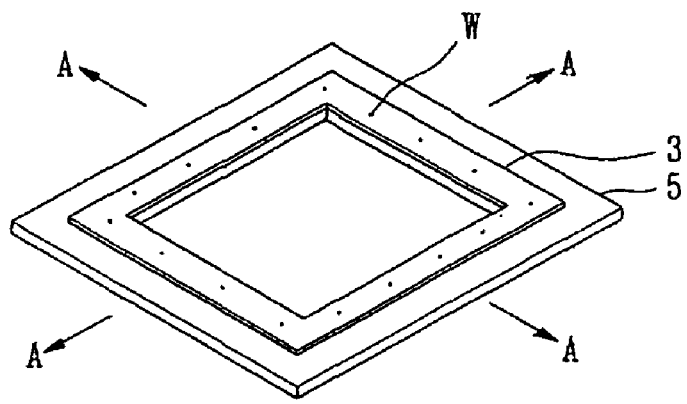
FIG. 4 is a perspective view illustrating that the mask is welded onto the mask frame.

FIG. 1 is an exploded perspective view schematically illustrating a mask for fabricating an organic electroluminescent device; FIG. 2 is a plan view of a mask formed with a pattern; FIG. 3 is a perspective view illustrating that the mask is fixed onto a mask frame by a weight bar; and FIG. 4 is a perspective view illustrating that the mask is welded onto the mask frame Referring to FIG. 1, to form an organic material layer (not shown) having a predetermined structure on one side of a substrate 1, a mask 3 having a predetermined pattern area 3a corresponding to the structure of the organic material layer is fixed to a mask frame 5 in a state in which the mask 3 is tensioned in a direction A, and is placed in front of the substrate 1. Then, a gaseous organic material is supplied from an organic material effusion cell (not shown) in a direction B, and is deposited on one side of the substrate 1 after passing through the pattern area 3a of the mask 3 and an opening 5a of the mask frame 5, thereby forming an organic material layer having a predetermined structure corresponding to the pattern of the pattern area 3a.

Referring to FIG. 2, the mask 3 includes the pattern area 3a formed as a predetermined pattern, and an edge 3b to be fixed on the mask frame 5.

Referring to FIGS. 3 and 4, to weld the mask 3 onto the mask frame 5, the mask 3 is put on the mask frame 5 in a state in which the mask 3 is tensioned in the direction A. Then, a weight bar 7 is seated on the mask 3 so that the tensioned mask 3 is temporarily fixed to the mask frame 5. Thereafter, the edge 3b of the mask 3 is welded onto the mask frame 5, particularly, at a welding point based on spot welding. Such spot welding is performed continuously while the position of the weight bar 7 on the mask 3 is changed.

However, while the weight bar 7 is seated on or is being moved on the mask 3, a fine pattern formed on the pattern area 3a of the mask 3 may be damaged by the weight bar 7. To protect the fine pattern from damage due to the weight bar 7, a worker must cautiously handle the weight bar 7, thereby increasing the burden on the worker.

Furthermore, as described above, when the pattern of the mask 3 is damaged by the weight bar 7, the mask 3 cannot be used any longer for forming the organic material layer of the organic electroluminescent device. Therefore, such a mask has to be scrapped or modified, thereby increasing production cost.

Figure 5:
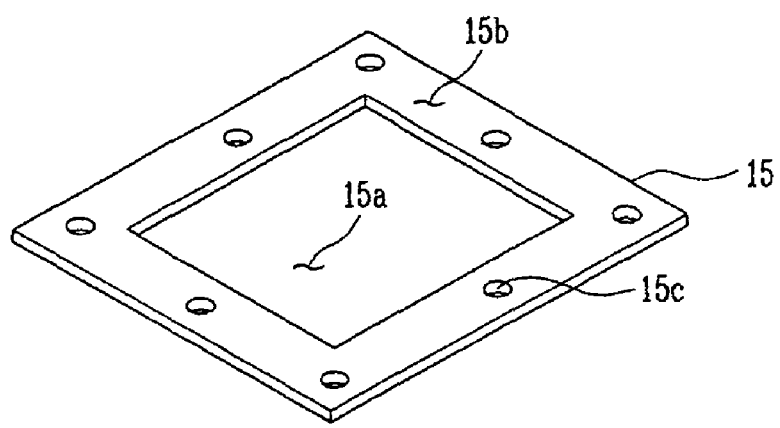
FIG. 5 is a perspective view of a mask frame according to a first embodiment of the present invention.
Figure 6A:
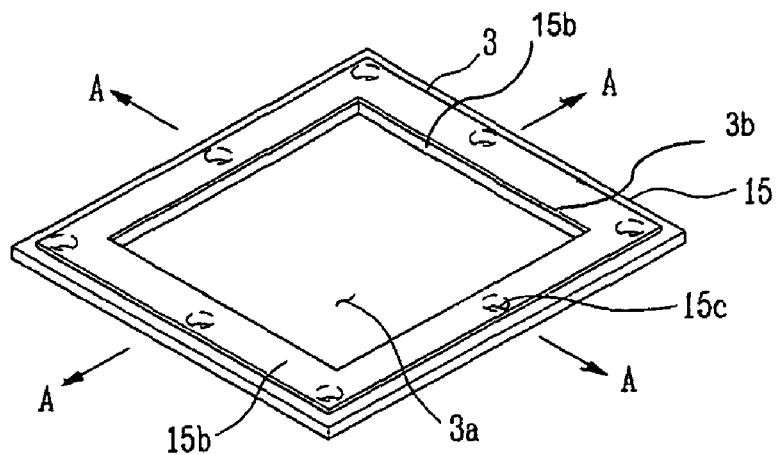
FIGS. 6A thru 6C are perspective views illustrating processes of welding the mask onto the mask frame of FIG. 5.
Figure 6B:
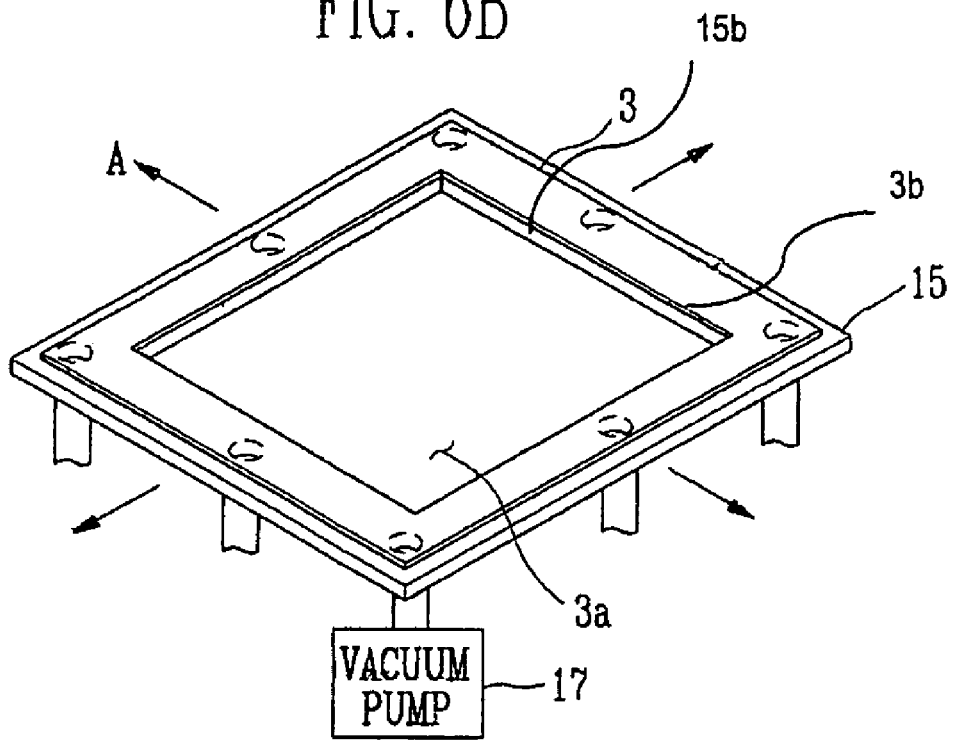
Figure 6C:
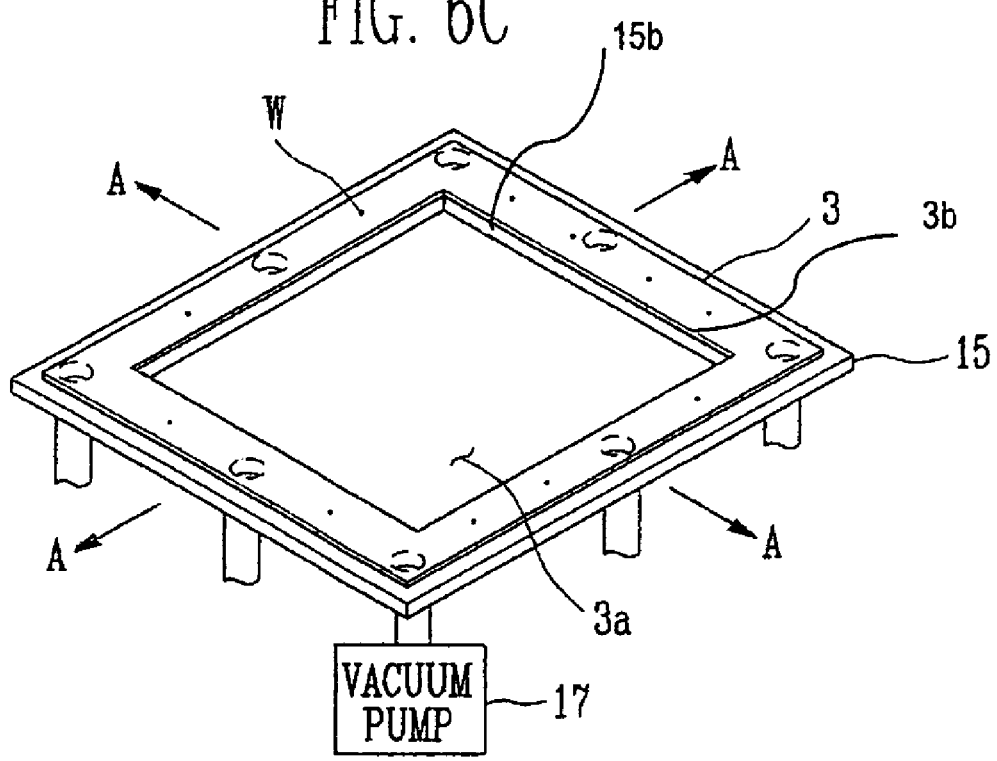

FIG. 5 is a perspective view of a mask frame according to a first embodiment of the present invention; and FIGS. 6A thru 6C are perspective views illustrating processes of welding the mask onto the mask frame of FIG. 5.

Referring to FIGS. 5 and 6, a mask frame 15 is provided for fixing a mask thereon by welding or the like. The mask is used for forming an organic material layer of an organic electroluminescent device. Generally, a through opening 15a corresponding to a pattern area of a mask is formed in a center portion of the mask frame 15, and a base 15b corresponding to edges around the pattern area is formed around the through opening 15a.

According to a first embodiment of the present invention, the base 15b is formed with a plurality of holes 15c penetrating the base 15b. In the first embodiment of the present invention, the holes 15c have a circular shape, but the invention is not limited thereto. Alternatively, the holes 15c may have various shapes. The holes 15c are used as passages for the discharge of air so that the edges 3a of the mask 3 are seated on the base 15b of the mask frame 15 by a vacuum suction method.

FIGS. 6A thru 6C are perspective views illustrating processes of welding the mask onto the mask frame of FIG. 5.

Referring to FIGS. 4, 5 and 6A thru 6C, a vacuum suction means (e.g., a vacuum pump 17) is coupled to the hole 15c on a rear surface of the base 15c. For reference, a surface of the base 15b, on which the edge of the mask 3 is seated, will be called a front surface, and the other surface of the base 15b will be called a rear surface. Therefore, when the vacuum pump 17 operates, air is discharged from the front surface of the base 15b to the rear surface of the base 15b through the hole 15c. When the air is discharged from one side of mask 3, the air pressure on the one side where air is discharged from decreases. The air pressure difference on two sides of mask 3 firmly presses mask 3 to base 15b of mask frame 15. As a result, the edge 3a of the mask 3 is seated on the base 15b of the mask frame 15 by the vacuum suction method. In the drawings, one vacuum pump 17 is representatively illustrated, but the number of vacuum pumps is not limited thereto.

Figure 7:
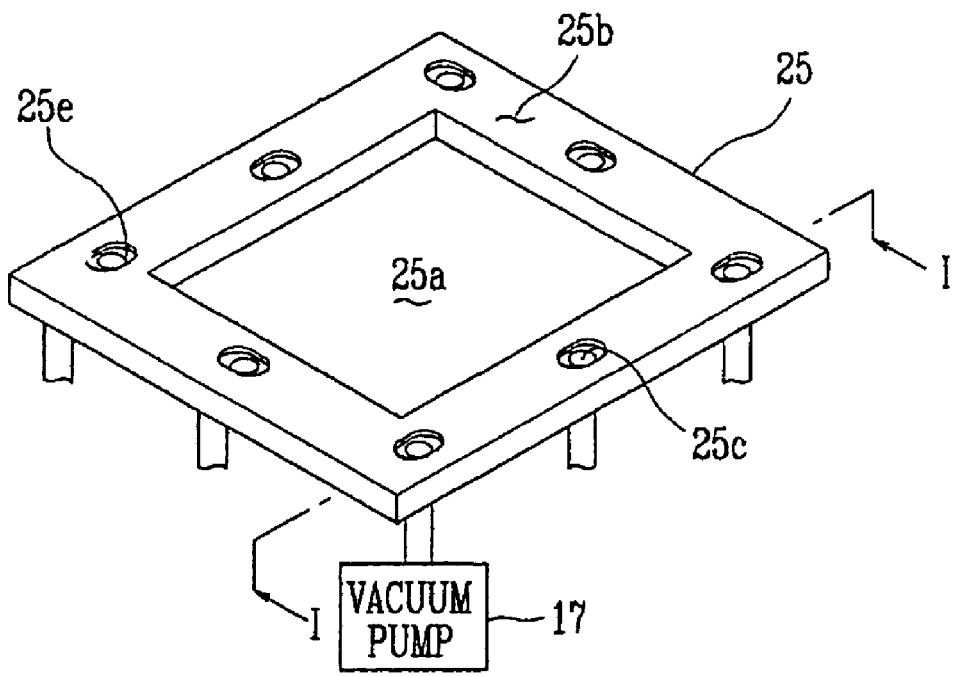
FIG. 7 is a perspective view of a mask frame according to a second embodiment of the present invention.
Figure 8:
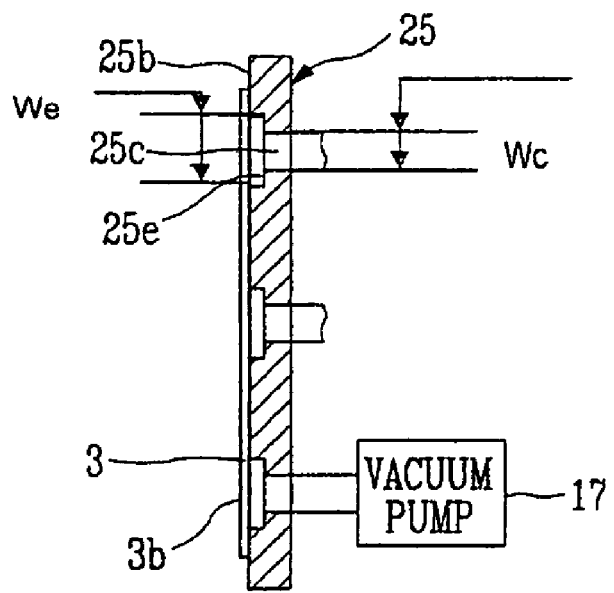
FIG. 8 is a sectional view, taken along line I-I of FIG. 7, illustrating that the mask is attached to the mask frame.
Figure 11:
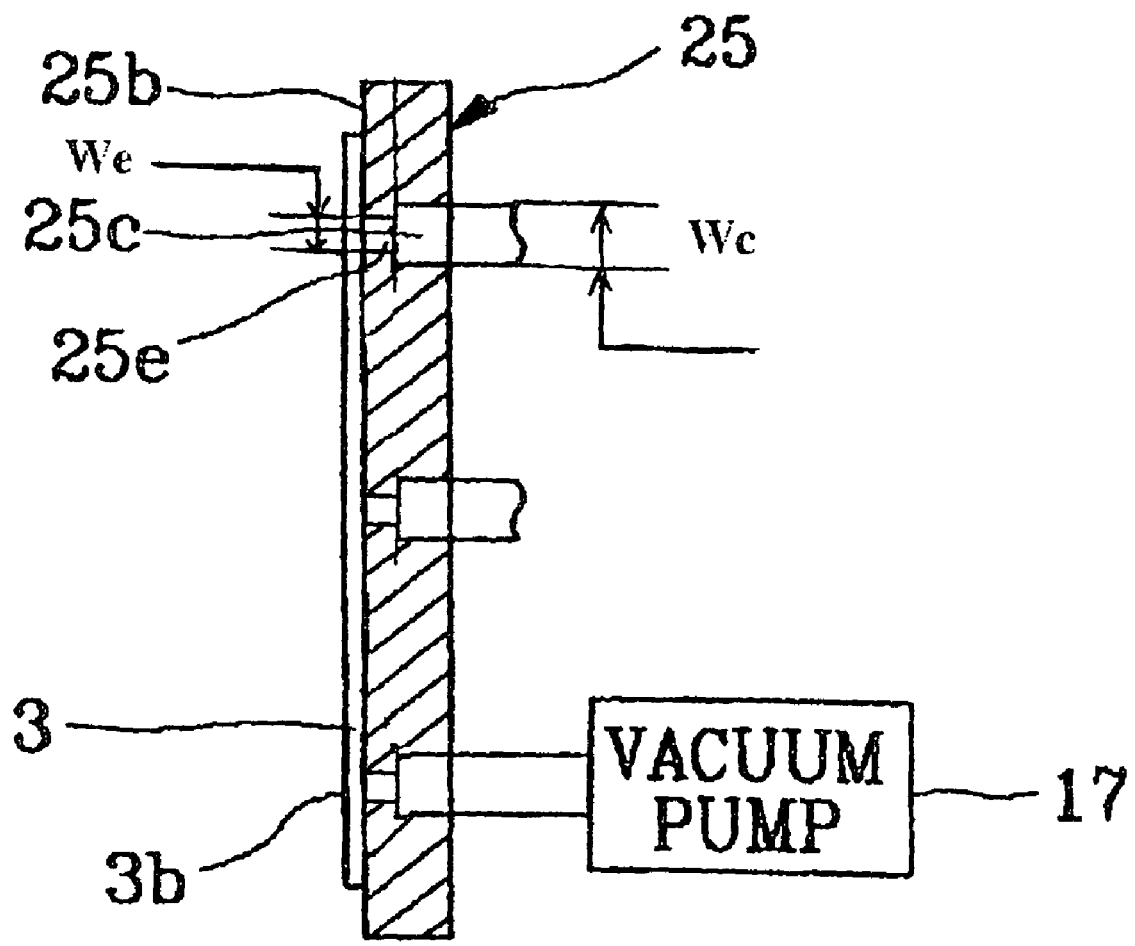
FIG. 11 is another sectional view, taken along line I-I of FIG. 7, illustrating that the mask is attached to the mask frame.

FIG. 7 is a perspective view of a mask frame according to a second embodiment of the present invention; FIG. 8 is a sectional view, taken along line I-I of FIG. 7, illustrating that the mask is attached to the mask frame and the diameter (We) of groove 25e is larger than vacuum hole 25c (Wc); and FIG. 11 is a sectional view, taken along line I-I of FIG. 7, illustrating that the mask is attached to the mask frame, and the diameter (We) of groove 25e is smaller than the diameter (Wc) of vacuum hole 25c.

According to a second embodiment of the present invention, as shown in FIGS. 7 and 8, a front surface of a base 25b of a mask frame 25 is provided with a groove 25e formed therein and communicating with a hole 25c, the groove 25e having a larger diameter than the hole 25c. In this manner, the surface area for vacuum suction is increased, thereby enhancing vacuum suction efficiency at the edge of the mask.

Alternatively, the groove 25e may have a smaller diameter than the hole 25c, and the vacuum pressure applied on mask 3 increased as compared to the vacuum pressure generated at hole 25c by the vacuum suction means (e.g., vacuum pump), thereby enhancing vacuum suction efficiency at the edge of the mask 3.

Figure 9:
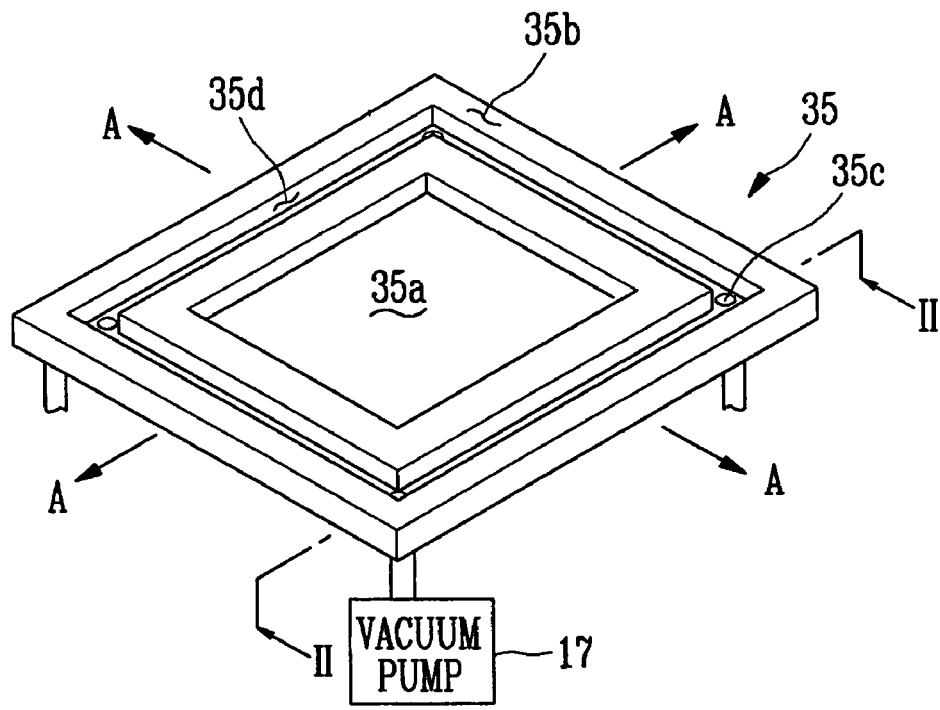
FIG. 9 is a perspective view of a mask frame according to a third embodiment of the present invention.
Figure 10:
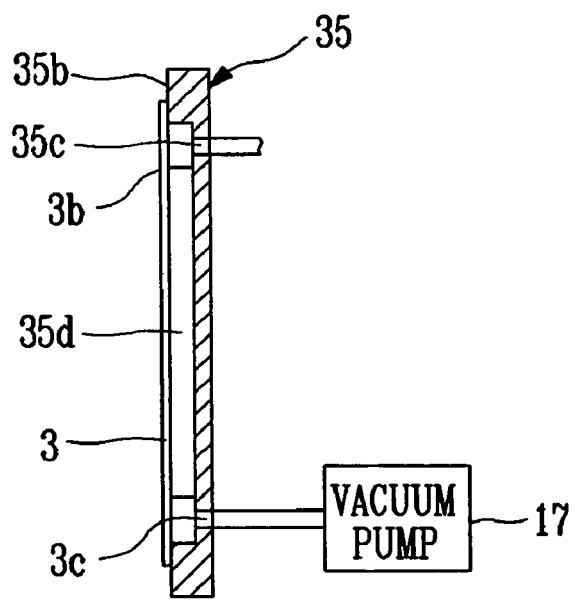
FIG. 10 is a sectional view, taken along line II-II of FIG. 9, illustrating that the mask is attached to the mask frame.

FIG. 9 is a perspective view of a mask frame according to a third embodiment of the present invention; and FIG. 10 is a sectional view, taken along line II-II of FIG. 9, illustrating that the mask is attached to the mask frame.

According to a third embodiment of the present invention, as seen in FIGS. 9 and 10, the groove 35d can have a trench structure so that adjacent holes 35c are connected to, and communicate with, each other. Particularly, the front surface of the base 35b of the mask frame 35 can have a trench structure as shown in FIG. 9. That is, the trench structure is achieved by a vacuum groove 35d communicating with holes 35c and surrounding a through opening 35a. Thus, the surface area having an effect on the vacuum suction at the edge of the mask 3 is increased.

Below, a method of fixing the mask on the mask frame according to the first embodiment of the present invention will be described.

Referring to FIGS. 6A thru 6C, the base 15b of the mask frame 15 is provided with holes 15c through which air is discharged by the vacuum pump 17. The mask 3 (FIG. 4) having a predetermined pattern is seated on the front surface of the mask frame 15. At this point, the base 15b of the mask frame 15 is covered by the edge 3b of the mask 3, thereby closing a top portion of the holes 15c. Then, the mask 3 is tensioned in the direction A.

Thereafter, the vacuum pump 17 is coupled to a bottom portion of each hole 15c. When the vacuum pump 17 operates, air in the hole 15c is discharged toward the vacuum pump 17, so that the edge 3b of the mask 3 is closely attached to the front surface of the mask frame 15 by the vacuum suction. In this state, spot welding is applied to the edge 3b of the mask 3 at a welding point, and the mask 3 is fixed onto the mask frame 15.

As described above, because the mask 3 is attached to the front surface of the mask frame 15 by discharging air through the hole 15c, the pattern formed on the pattern area 3a of the mask 3 is protected from damage.

Likewise, referring to FIGS. 7 and 8, according to the second embodiment of the present invention, the mask 3 is seated on the front surface of the mask frame 25. At this point, the edge 3b of the mask 3 is placed on a top portion of the groove 25e formed on the base 25b of the mask frame 25. Then, the vacuum pump 17 is coupled to the hole 25c exposed to the rear surface of the mask frame 25. When the vacuum pump 17 operates, the air in the groove 25e and in the hole 25c is discharged toward the vacuum pump 17.

As a result, vacuum suction due to the discharged air causes the edge 3b of the mask 3 to be closely attached to the base 25b of the mask frame 25. The area under the vacuum suction is increased by the groove 25e, so that the edge 3b of the mask 3 is more firmly attached to the base 25b of the mask frame 25.

In this state, spot welding is applied to the edge 3b of the mask 3 at a welding point, and therefore the mask 3 is fixed to the mask frame 35.

Further, referring to FIGS. 9 and 10, according to the third embodiment of the present invention, the mask 3 is seated on the front surface of the mask frame 35. At this point, the edge 3b of the mask 3 is placed on a top portion of the vacuum groove 35d formed on the base 35b of the mask frame 35. Then, the vacuum pump 17 is coupled to the hole 35c exposed to the rear surface of the mask frame 35. When the vacuum pump 17 operates, the air in the vacuum groove 35d and in the hole 35c is discharged toward the vacuum pump 17.

As a result, the vacuum suction due to the discharged air causes the edge 3b of the mask 3 to be closely attached to the base 35b of the mask frame 35. The area under the vacuum suction is increased to the maximum by the vacuum groove 35d, so that the edge 3b of the mask 3 is more firmly attached to the base 35b of the mask frame 35.

In this state, spot welding is applied to the edge 3b of the mask 3 at a welding point, and therefore the mask 3 is fixed to the mask frame 35.

As a result of the present invention, air is discharged through the holes so that the vacuum suction between the edge of the mask and the base of the mask frame causes the mask to be closely attached to the mask frame, thereby protecting the pattern formed in the pattern area of the mask from damage.

According to the embodiments of the present invention, the mask is attached to the mask frame by vacuum suction, and then spot welding is applied thereto, so that the mask is safely fixed to the mask frame without damage to the pattern in the pattern area of the mask.

Although preferred embodiments of the present invention have been shown and described, it should be appreciated by those skilled in the art that changes may be made in this embodiment without departing from the principles and spirit of the invention, the scope of which is defined in the claims and their equivalents.

What is claimed is:

1. An apparatus for depositing gaseous organic material for a display device, the apparatus comprising:
    a mask having a pattern area for selectively passing the gaseous organic material and depositing the selectively passed gaseous organic material on a predetermined area of a substrate of the display device, and a mask edge defining the pattern area;
    a mask frame comprising:
        a through opening corresponding to the pattern area of the mask;
        a base disposed immediately surrounding the opening and corresponding to the mask edge; and
        the base comprising a plurality of discrete discharging holes for discharging air through at least one of the plurality of discharging holes of the mask frame; and
    the mask frame being in immediate physical and direct contact with the mask by discharging the air through at least one of the discharging holes of the mask frame by a vacuum suction and being welded to the mask while held in direct physical contact with the mask by vacuum suction created by discharge of the air through the discharging holes, and with the mask being tensioned in a direction outwardly and away from the mask edge of the mask.

2. The apparatus according to claim 1, with the base having a surface disposed against the mask edge, the surface bearing a plurality of grooves having respective diameters larger than corresponding diameters of the discharging holes, with the plurality of grooves communicating with the discharging holes.

3. The apparatus according to claim 2, wherein the plurality of grooves have a trench structure by means of which adjacent one of the discharge holes are connected to each other.

4. The apparatus according to claim 2, wherein each groove is formed so as to surround a respective through opening.

5. The apparatus according to claim 1, with the base having a surface disposed against the mask edge, the surface bearing a plurality of grooves having respective diameter smaller than respective diameter of the discharging holes, with the grooves communicating with the discharging holes.

6. The apparatus according to claim 5, wherein the plurality of grooves have a trench structure by means of which adjacent one of the discharge holes are connected to each other.

7. The apparatus according to claim 5, wherein each groove is formed so as to surround a respective through opening.

8. An apparatus for depositing gaseous organic material for a display device, comprising:
    a mask having a pattern area for selectively passing the gaseous organic material and depositing the selectively passed gaseous organic material on a predetermined area of a substrate of the display device, and a mask edge defining the pattern area;

a mask frame bearing a through opening having a predetermined size, with a base surrounding the through opening and at least one discharging hole being formed in the base of the mask frame;

the mask selectively passing the gaseous organic material from a pattern area corresponding to the through opening and an edge corresponding to the base, on the mask frame;

the mask being in direct and immediate physical contact with the mask frame by a vacuum suction generated by discharge of air through said at least one discharging hole; and the edge of the mask being fixed to the base of the mask frame by welding while the mask is held in direct physical contact with the mask frame by the vacuum suction created by discharge of air through the discharging holes, and the mask being tensioned in a direction outwardly and away from the mask edge of the mask.

9. The apparatus according to claim 8, wherein the vacuum suction is achieved by coupling a vacuum suction unit to said at least one discharging hole.

10. The apparatus according to claim 9, wherein the vacuum suction unit comprises a vacuum pump.

11. The apparatus according to claim 8, further comprising the step of tensioning the mask before welding.

12. The apparatus according to claim 8, wherein said at least one discharging hole comprises a plurality of discharging holes formed in the base, and wherein a first surface of the base, to which the mask edge is attached by the vacuum suction, has the grooves formed therein, each groove having a diameter larger than a diameter of a respective discharging hole, said each groove communicating with said respective discharging hole.

13. The apparatus according to claim 12, wherein said grooves have a trench structure by means of which adjacent one of the discharge holes are connected to each other.

14. The apparatus according to claim 13, with the mask frame comprised of the mask edge defining the pattern area.

15. The apparatus according to claim 12, with the mask frame comprised of the mask edge defining the pattern area.

16. The apparatus according to claim 8, wherein said at least one discharging hole comprises a plurality of discharging holes formed in the base, and wherein a first surface of the base, to which the mask edge is attached by vacuum suction, is formed with grooves having respective diameters smaller than respective diameters of the discharging holes, said grooves communicating with the discharging holes.

17. The apparatus according to claim 16, wherein said grooves have a trench structure by means of which adjacent one of the discharge holes are connected to each other.

18. The apparatus according to claim 16, with the mask frame comprised of the mask edge defining the pattern area.

19. The apparatus according to claim 8, with the mask frame comprised of the mask edge defining the pattern area.

20. An apparatus, comprising:

a mask having a pattern area and a mask edge defining the pattern area, with a configuration of the pattern area permitting gaseous organic material to selectively pass through the mask, and with the mask formed by a material preventing the gaseous organic material from passing through the mask; and a mask frame comprising:
  a through opening corresponding to the pattern area of the mask;
  a base disposed immediately surrounding the through opening and corresponding to the mask edge; and
  the base comprising at least one discrete discharging hole for discharging air through the at least one discharging hole of the mask frame;

the mask frame being in immediate physical and direct contact with the mask by discharging the air through the at least one discharging hole of the mask frame by a vacuum suction and being welded to the mask while held in direct physical contact with the mask by the vacuum suction created by discharge of the air through the at least one discharging hole; and the mask being tensioned in a direction outwardly and away from the mask edge of the mask.

* * * * *